United States Patent
Imondi et al.

(10) Patent No.: US 7,565,587 B2
(45) Date of Patent: Jul. 21, 2009

(54) BACKGROUND BLOCK ERASE CHECK FOR FLASH MEMORIES

(75) Inventors: Giuliano Gennaro Imondi, Rieti (IT); Giovanni Naso, Frosinone (IT)

(73) Assignee: Micron Technology, Inc., Boise, ID (US)

( * ) Notice: Subject to any disclaimer, the term of this patent is extended or adjusted under 35 U.S.C. 154(b) by 136 days.

(21) Appl. No.: 11/519,415

(22) Filed: Sep. 12, 2006

(65) Prior Publication Data

US 2007/0022332 A1   Jan. 25, 2007

Related U.S. Application Data

(63) Continuation of application No. 10/286,450, filed on Nov. 1, 2002, now Pat. No. 7,117,402.

(30) Foreign Application Priority Data

Nov. 2, 2001   (IT)   .......................... RM2001A0647

(51) Int. Cl.
    *G11C 29/00* (2006.01)
(52) U.S. Cl. ...................... 714/718; 714/716; 714/763; 714/799; 714/785; 714/703; 365/201
(58) Field of Classification Search ................. 714/716, 714/718, 724, 725, 729, 745, 703, 763, 785, 714/799; 365/185.18, 185.19, 189.15, 201
See application file for complete search history.

(56) References Cited

U.S. PATENT DOCUMENTS

| | | | |
|---|---|---|---|
| 5,414,664 A | 5/1995 | Lin | |
| 5,675,540 A | 10/1997 | Roohparvar | |
| 5,909,399 A * | 6/1999 | Tanaka et al. | 365/185.33 |
| 6,108,263 A * | 8/2000 | Bauser et al. | 365/189.15 |
| 6,128,224 A | 10/2000 | Morton et al. | |
| 6,240,032 B1 | 5/2001 | Fukumoto | |
| 6,243,839 B1 * | 6/2001 | Roohparvar | 714/718 |
| 6,314,026 B1 | 11/2001 | Satoh | |
| 6,414,874 B2 | 7/2002 | Akaogi | |
| 6,483,752 B2 | 11/2002 | Hirano | |
| 6,498,752 B1 | 12/2002 | Hsu | |
| 6,529,413 B2 | 3/2003 | Lee et al. | |
| 6,580,659 B1 * | 6/2003 | Roohparvar | 365/236 |
| 6,711,701 B1 * | 3/2004 | Roohparvar et al. | 714/24 |
| 6,781,895 B1 * | 8/2004 | Tanaka et al. | 365/200 |
| 2003/0039145 A1 | 2/2003 | Keays | |

* cited by examiner

*Primary Examiner*—Esaw T Abraham
*Assistant Examiner*—Fritz Alphonse
(74) *Attorney, Agent, or Firm*—Leffert Jay & Polglaze, P.A.

(57) ABSTRACT

Memory devices and methods of operating memory devices provide for using differing potentials during erase verify operations facilitate normal erase operations and subsequent erase check operations. Such apparatus and methods facilitate subsequent checks for data gain of erased memory cells using abbreviated procedures compared to normal erase operations.

21 Claims, 4 Drawing Sheets

BACKGROUND BLOCK ERASE CHECK FOR FLASH MEMORIES

RELATED APPLICATIONS

This application is a continuation of U.S. patent application Ser. No. 10/286,450 (allowed), filed Nov. 1, 2002 now U.S. Pat. No. 7,117,402 and titled "BACKGROUND BLOCK ERASE CHECK FOR FLASH MEMORIES," which is commonly assigned and incorporated by reference in its entirety herein. This application further claims priority to Italian Patent Application Serial No. RM2001A000647, filed Nov. 2, 2001, entitled "Background Block Erase Check for Flash Memories."

TECHNICAL FIELD

The present invention relates in general to erasing of flash memory devices, and in particular, to an on-chip method and apparatus for performing an erase check of each single block of the flash memory with a known margin against data gain, with minimal time loss.

BACKGROUND

"Writing" or "erasing" a flash memory cell corresponds to shifting the threshold voltage (Vt) of the cell up or down in relation to the reading voltage applied to the gate of the cell. For example, using a read voltage of 5.0 V, the cell is considered erased if its Vt is 4.0 V or less (with a 1.0 V erase margin). The cell is considered written when its Vt is shifted to 6.0V or more (with a 1.0 V write margin). The margin is necessary because the cell may slightly change its Vt when it is cycled with multiple write/erase operations (assuming fixed length and numbers of write/erase pulses), or it may simply change over time during storage. The Vt increase of an erased cell is dubbed "data gain" while the Vt decrease of a written cell is dubbed "data loss." Usually chips are erased before being shipped to the customer. A small data gain/data loss is typical for flash memory technology and it can be tolerated. Excessive data gain and data loss may, however, cause errors in reading the flash memory.

Erasing a flash memory with a given margin against data gain requires a complex algorithm. The flash memory chips usually contain internal circuits to erase single blocks of memory cells, then the entire memory, with a specified erase margin. The full internal erase-erase check algorithm involves many steps such as Pre-program, Pre-program Verify, Erase Verify, Erase, Depletion check, Compaction, Erase Verify. The Erase Verify step checks that all cells are erased with a desired margin. If the Erase Verify does not give the expected result, the chip will cycle over some of the above steps. Consequently, the overall erase-erase check operation is quite long. For example, for a 32M flash, it may take up to 20 seconds on flash memory test equipment, which may be up to 40% of the total test time. Even more time is needed for larger memories.

It is possible to erase the memory without making use of the internal algorithm, by using a simplified external erase algorithm with parameters specified by the flash test equipment. This is normally done by flash manufacturers at the time of the product final test. The external algorithm does not perform complex cycles, avoiding increased testing time. In most cases, the external algorithm used at final test is sufficient for a good erase. However, a few cells in some memory chips may be imperfectly erased and thus be more susceptible to data gain. With the external algorithm, it is not guaranteed that all of the chips will be erased with an adequate safety margin. Some chips, particularly those that have been in storage for a long period of time will be subject to data gain. The customer can follow three possible strategies to write data into flash memories on the production line:

1) The customer can assume that the flash memory chip is completely erased and proceed to write data into the memory without any prior check. In this case the customer does not spend time to perform erase checks but if the memory is not completely erased there can be errors in the data written or if the memory has no safe erase margins there may be future data corruption due to data gain or disturbance.

2) The customer can perform a regular read of the entire block and see if it is erased before writing new data. This regular read is not a background operation, it can only be performed location by location. Furthermore, a regular read can only be performed at a fixed reference value (typically 5V) and no safety data retention margins are guaranteed. The customer spends time for this regular read and still risks future data corruption.

3) The customer can perform a regular erase before writing. In this case, the customer can be sure that the block is erased with safe margins but this is a time consuming operation that has a cost. It would thus be desirable to provide a more efficient method of ensuring that flash memory are completely erased to adequate safety margins before they are installed by customers.

Although, various embodiments have been illustrated using particular electronic components it will be understood by those of ordinary skill in the art that other circuit elements could be implemented and that the present invention is not limited to the arrangement of circuit elements disclosed. Moreover, it will also be understood in the art that the present invention could be used in connection with non-volatile memory devices other than flash memory. Therefore, the present invention is not limited to an erase check circuit for flash memory.

DETAILED DESCRIPTION

Figure 1:
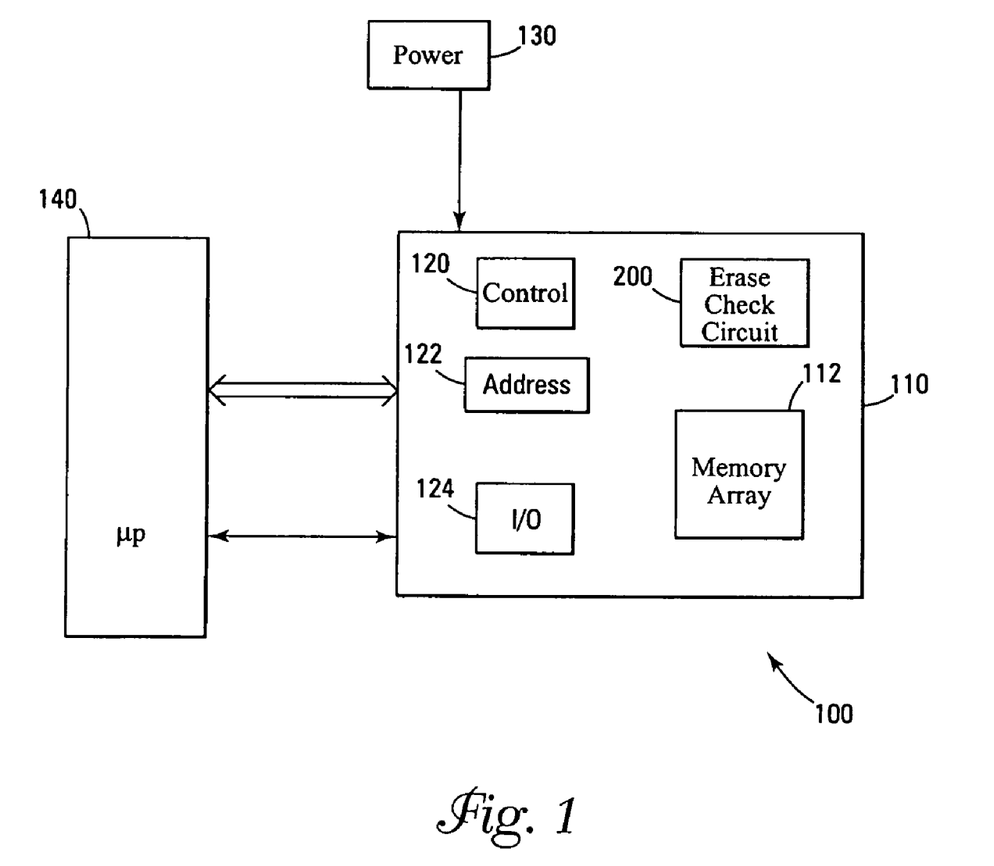
FIG. 1 is a block diagram of a memory circuit coupled to a processor and a voltage supply according to an embodiment of the invention.

FIG. 1 shows a computer system 100 including a memory circuit 110, a power supply 130 and a processor 140. Memory 110 includes a memory array 112 of non-volatile memory cells (which can be flash memory cells), a circuit for performing block erase check operations 200, and a controller 120 that controls detailed operations of memory 110 such as the various individual steps necessary for carrying out writing, reading, and erasing operations. Memory 110 also includes an address decoder circuit 122 for decoding and selecting addresses provided by processor 140 to access appropriate memory cells in memory array 112, and an I/O circuit 124 for providing bi-directional communications between processor 140 and memory circuit 110.

Figure 2:
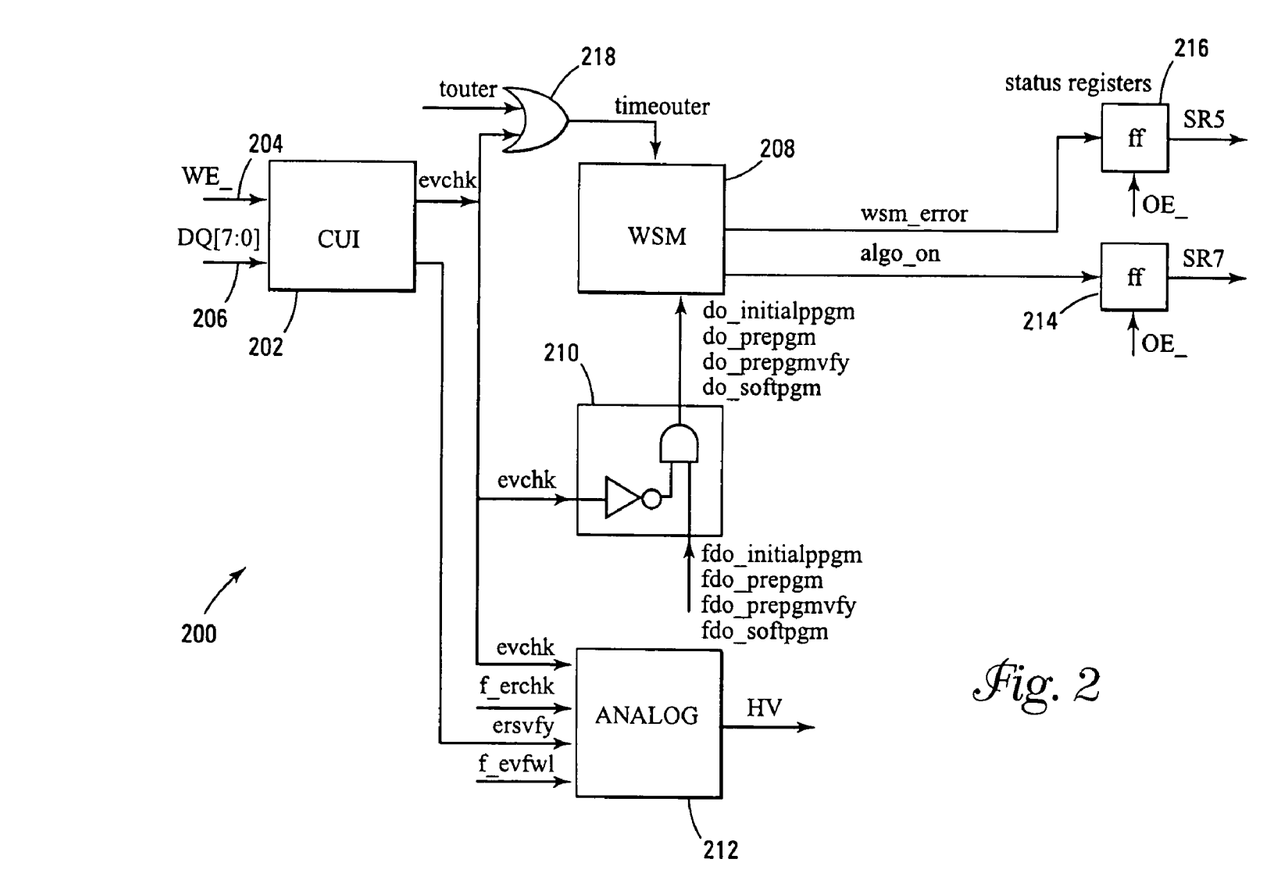
FIG. 2 is a block diagram of an erase check circuit for a flash memory according to an embodiment of the invention.

As with many flash memory operations, internal (on-chip) write and erase algorithms are started by commands given to the flash memory by the user or an external device such as processor 140. In the present invention processor 140 may be part of a flash memory user system or may be included in flash memory test equipment. A schematic diagram of an on-chip circuit 200 for performing the block erase check operations according to an example of the present invention is shown in FIG. 2. Circuit 200 may include a command user interface or command interface (CUI) 202 that recognizes all flash memory commands including commands specific to the erase check operation of the present invention. CUI 202 may also provide various output signals for operation of components of the flash memory. CUI 202 may be activated by the write enable signal (WE_) on write enable line 204 and may receive commands on one or more input/output (I/O) lines 206 (shown in FIG. 2 as 8 lines and designated DQ[7:0]). The commands on the I/O lines 206 may be codes such as commands from external testing equipment and may be latched into the memory by the WE_ signal, for example, when WE_ is low. The commands are interpreted by CUI 202 logic and executed by a Write State Machine (WSM) 208, which may independently supervise execution of the entire write and erase algorithms.

The present invention includes execution of one or more commands, referred to collectively as a "Block Erase Check." The block erase check enables WSM 208 to internally start and independently execute the erase check or verify operation of all the locations of the selected block (sector) using proper safety margins.

Figure 3:
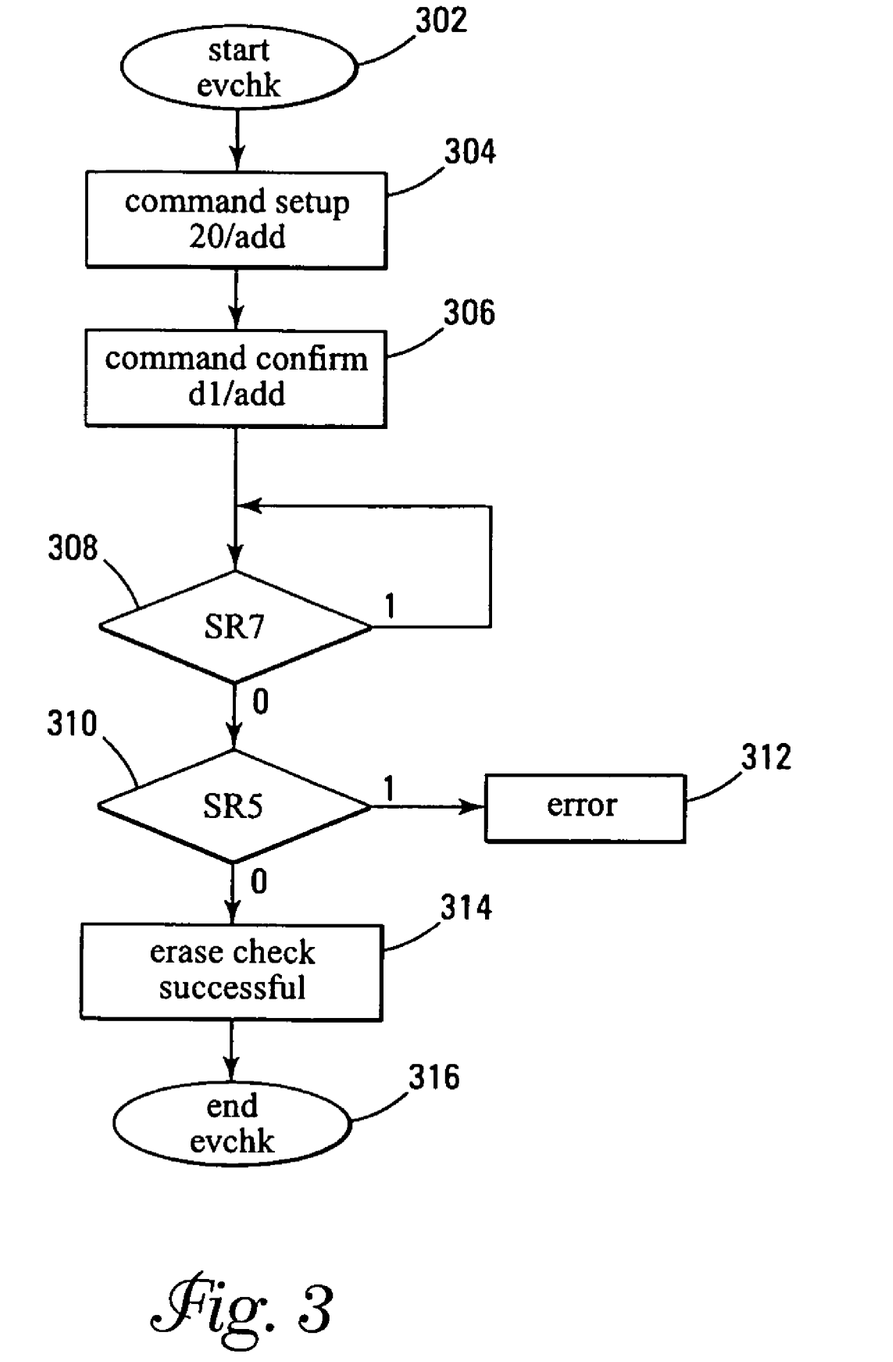
FIG. 3 is a flow diagram of an erase check routine according to an embodiment of the invention from the standpoint of a user or external device.

FIG. 3 shows a flow diagram of the operation of a basic block erase check routine evchk (Block Erase Check) from the standpoint of a user or external device, according to the present invention. The Block Erase Check command may be given in two cycles. In command setup block 304, which follows start block 302, a set-up command (code 20) is applied to the I/O lines 206 by an external device, such as the flash test equipment. In addition, the address (add) of the sector or block to be verified is applied to the chip memory address lines (not shown).

The erase check routine starts once the second cycle, shown at block 306, confirmation (command confirm) is given (code d1) on the I/O lines 106 while the address (add) of the sector to be verified is applied to the address lines.

Circuit 200 also may include one or more status indicators readable by external devices, such as status registers 214 and 216. Status register 214 (SR7), shown as a flip-flop, indicates at 308 when WSM 208 has completed scanning all the sector locations. When the output of status register 214 is zero, WSM 208 has completed address scanning. A second status register 216 (SR5), which may also be a flip-flop, flags at 310 whether the Block Erase Check operation has been successfully completed. For example, if status register 216 is zero, it means that the Block Erase Check operation has been successful at 314, while if status register 216 is one, it indicates an error at 312. Both registers 214 and 216 may be read using the Output Enable OE_ signal, as shown in FIG. 2. The operation concludes at end evchk, block 316.

While there are a number of signals output by CUI 202, to simplify the drawing, only two are illustrated in FIG. 2 The first signal, Evchk, enables the Block Erase Check operation. The second signal, ersvfy, enables the normal Erase Verify operation.

For manufacturing flexibility, flash memories are usually provided with fuses to trim the verify voltages during the testing phase. Analog block 212 is designed to adjust its output voltage HV according to the signals f_evfwl coming from a set of trimming fuses (not shown in the figure) for the normal Erase Verify step, and according to the signals f_erchk coming from another set of trimming fuses (not shown in the figure) for the Block Erase Check operation of the present invention. The HV signal is used to read the memory cells and is applied to the word line of the memory array (not illustrated). The HV trimmable value is typically in the range 3.25V-5V. The normal reading word line voltage is 5V.

The erase margin or erase verify value used in the erase operation executed with the internal algorithm is typically about 3.75V. The Block Erase Check operation need not be performed using this value. If a tolerable data gain is 0.5 V, for example, the Block Erase Check command (20,d1) may be performed using a typical HV voltage of 4.25V on the memory word lines. This will ensure that only cells in which there has been excessive data gain will fail an erase check.

As noted above, WSM 208 manages all the basic operations involved in an erase or program algorithm. WSM 208 can perform or skip some of these basic operations according to a set of configuration fuses (not illustrated) that are provided for test flexibility.

Signal coming from configuration fuses include:
fdo_initialppgm to allow the initial pre program operation
fdo_prepgm to allow pre program operation
fdo_prepgmvfy to allow pre program verify operation
fdo_softpgm to allow depletion check/recovery operation Usually all the above operations are enabled for the internal erase algorithm, but during the Block Erase Check they may all be disabled by the signal evchk through logic block 210, which provides combinational logic to disable fdo_initialppgm, fdo_prepgm, fdo_prepgmvfy, fdo_softpgm when evchk is active. During Block Erase Check, only Erase and Erase Verify operations need be enabled for WSM 208.

In the standard internal erase algorithm, the signal touter, shown as one input to two input OR gate 218, stops further operation of WSM 208 when a time-out condition has been reached or when the maximum erase pulse count has been reached. This is needed to prevent WSM 208 from locking in a loop in attempting to erase a failed cell. In Block Erase Check, timeout is given by default, since evchk forces timeouter, the output of OR gate 218 to "1". WSM 208 will only execute one erase check and nothing else, flagging an error immediately if an erase check fails.

Figure 4:
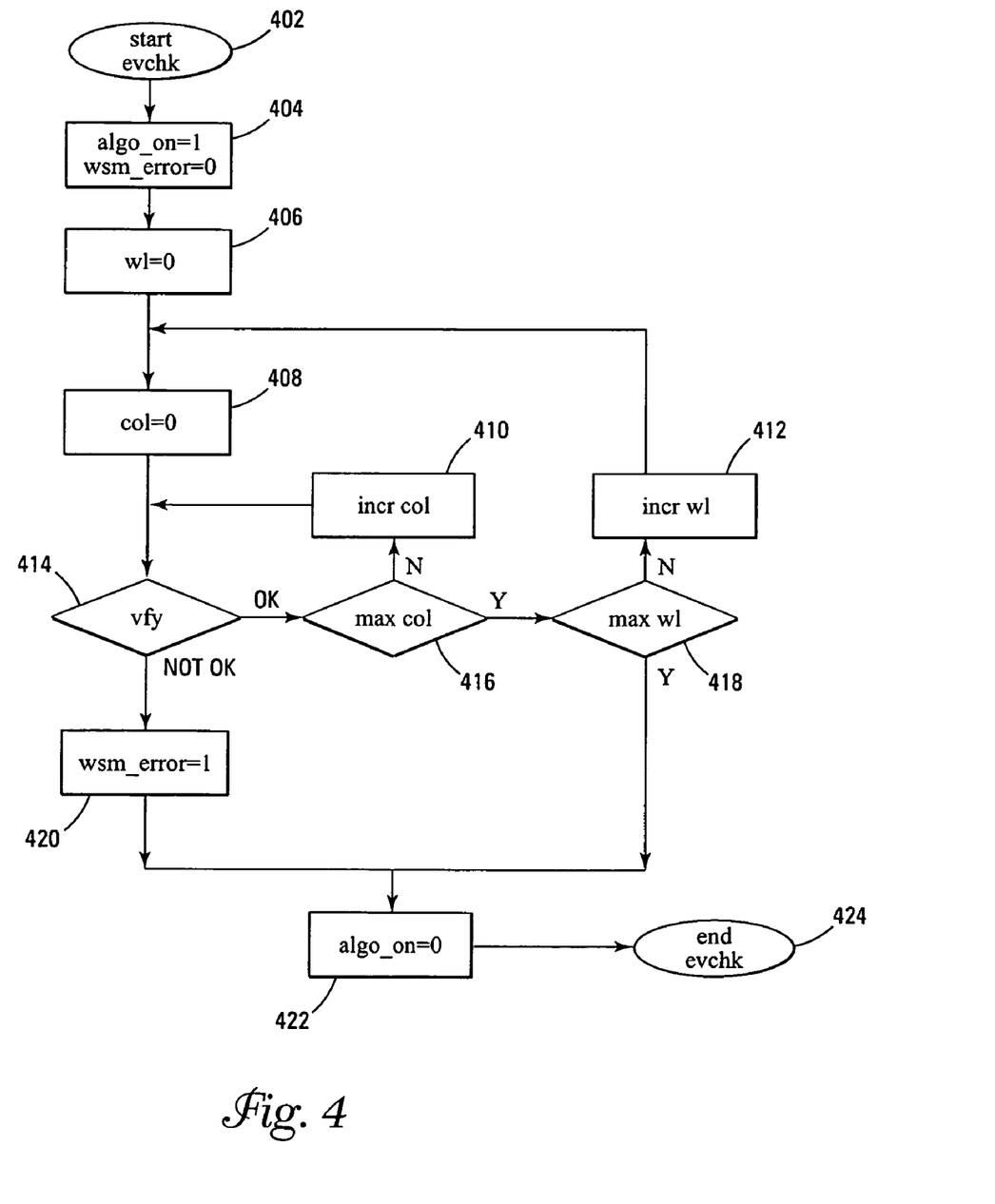
FIG. 4 is a flow diagram of an erase check routine according to an embodiment of the invention from an internal standpoint.

A flow diagram showing the operation of WSM 208 in performing the Block Erase Check from an internal standpoint is shown in FIG. 4. When the Block Erase Check command is recognized, operation begins at 402. At 404 the algo_on signal is set to "1" and the error flag wsm_error is initialized to "0." Blocks 406 and 408 show initializing of word line counter (wl) and column counter (col) (inside WSM 208) to "0." The memory location at address (wl, col) is erase verified at 414. If the result of the check operation is OK, the column and word line counters are incremented (incr col and incr wl) at 410 and 412, respectively. Assuming no errors, incrementing continues until the maximum (max col and max wl) values are reached at 416 and 418. Then, at 422 the algo_on signal is set to "0" to flag that the operation is completed. The first time an erase check operation fails, the signal wsm_error is set to "1" at 420 and the algorithm is immediately stopped, setting algo_on to "0" at 422. The operation concludes at end evchk, block 424.

CONCLUSION

A flash memory erase check circuit is disclosed. One embodiment includes an on-chip circuit that checks that the flash memory chip has been and continues to be thoroughly erased, even after data gain may have resulted, for example, from a long period of storage. The circuit may carry out the erase check operation in response to a single off-chip command. Another embodiment includes a method for performing the on-chip erase check. Embodiments of the present invention are fast, because unnecessary interactions between controller and memory are avoided. The present invention further provides safe erase checking, because the voltage used in the Erase Block Check insures an adequate margin versus further data gain. In another aspect the present invention may advantageously work in the background, because it is internally executed by a state machine upon receiving an external command from test equipment.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. A memory device, comprising:
    an array of non-volatile memory cells; and
    circuitry for control and access of the array of non-volatile memory cells;
    wherein the circuitry for control and access of the array of non-volatile memory cells is configured to perform an erase operation and to perform an erase check operation;
    wherein at least a portion of the erase operation determines whether memory cells are erased to a first margin and attempts to further erase memory cells that are not found to be within the first margin; and
    wherein after the erase operation determines that the memory cells are erased to the first margin, the erase check operation determines whether the memory cells that are erased to the first margin are erased to a second margin and ends when any memory cell erased to the first margin is found to not be within the second margin.

2. The memory device of claim 1, wherein the circuitry for control and access of the array of non-volatile memory cells is further configured to be responsive to a single external command to initiate the erase check operation.

3. The memory device of claim 1, wherein the circuitry for control and access of the array of non-volatile memory cells is further configured to immediately stop the erase check operation upon detecting an error.

4. The memory device of claim 1, wherein the first and second margins are each determined in response to values of fuses of the memory device.

5. The memory device of claim 1, wherein the circuitry for control and access of the array of non-volatile memory cells is further configured to temporarily disable portions of the erase operation when performing the erase check operation.

6. The memory device of claim 1, wherein the second margin represents a greater tolerance than the first margin.

7. A memory device, comprising:
    an array of non-volatile memory cells; and
    circuitry for control and access of the array of non-volatile memory cells;
    wherein the circuitry for control and access of the array of non-volatile memory cells is configured to perform an erase operation on the array of non-volatile memory cells;
    wherein the circuitry for control and access of the array of non-volatile memory cells is further configured to use a first word line potential to read a memory cell during an erase verify portion of the erase operation if a first control signal has a first logic level and to use a second word line potential to read a memory cell during the erase verify portion of the erase operation if the first control signal has a second logic level; and
    wherein the circuitry for control and access of the array of non-volatile memory cells is further configured to disable portions of the erase operation and to force a time-out of the erase operation if the first control signal has the second logic value.

8. The memory device of claim 7, wherein the second word line potential is greater than the first word line potential.

9. The memory device of claim 7, further comprising:
    wherein the circuitry for control and access of the array of non-volatile memory cells is further configured to perform a read operation on the array of non-volatile memory cells using a third word line potential to read a memory cell;
    wherein the second word line potential is between the first word line potential and the third word line potential.

10. The memory device of claim 7, wherein the first control signal is logically combined with a time-out signal to generate an output signal indicative of a time-out condition when the first control signal has the second logic level regardless of a logic value of the time-out signal.

11. The memory device of claim 7, wherein the first control signal is logically combined with one or more configuration signals to invert logic levels of the one or more configuration signals when the first control signal has the second logic level.

12. The memory device of claim 7, wherein the circuitry for control and access of the array of non-volatile memory cells is further configured to generate a first output signal indicative of whether the erase operation is complete and a second output signal indicative of whether the erase operation is successful.

13. The memory device of claim 12, wherein the circuitry for control and access of the array of non-volatile memory cells is further configured to generate the first output signal having a value indicative of completion of the erase operation and to generate the second output signal having a value indicative of failure of the erase operation as soon as any memory cell is found not to be erased when using the second word line potential to read a memory cell during the erase verify portion of the erase operation while the first control signal has the second logic level.

14. The memory device of claim 13, wherein the circuitry for control and access of the array of non-volatile memory cells is further configured to cease the erase operation upon generating the second output signal having the value indicative of failure of the erase operation.

15. A method of operating a memory device having an array of non-volatile memory cells, the method comprising:
    performing an erase operation on at least a portion of the array of non-volatile memory cells, comprising:
        erasing memory cells of the portion of the array;
        verifying that memory cells of the portion of the array are erased by attempting to read the memory cells using a first word line potential; and
        repeating erasing the memory cells of the portion of the array if any of the memory cells are found not to be erased using the first word line potential;
    subsequent to performing the erase operation, checking that memory cells of the portion of the array that were found to be erased using the first word line potential are erased by attempting to read the memory cells that were found to be erased using the first word line potential using a second word line potential different from the first word line potential; and providing a signal readable by an external device if any of the memory cells that were found to be erased using the first word line potential are found not to be erased using the second word line potential.

16. The method of claim 15, wherein checking that memory cells of the portion of the array that were found to be erased using the first word line potential are erased by attempting to read the memory cells of the portion of the array that were found to be erased using the first word line potential using the second word line potential is initiated in response to a command received from an external device.

17. The method of claim 16, wherein checking that memory cells of the portion of the array that were found to be erased using the first word line potential are erased by attempting to read the memory cells of the portion of the array that were found to be erased using the first word line potential using the second word line potential is performed as a subset of portions of an erase operation and wherein other portions of the erase operation are temporarily disabled in response to the command received from the external device.

18. The method of claim 15, wherein checking that memory cells of the portion of the array that were found to be erased using the first word line potential are erased by attempting to read the memory cells of the portion of the array that were found to be erased using the first word line potential using the second word line potential is terminated if any of the memory cells are found not to be erased using the second word line potential.

19. The method of claim 15, wherein the first word line potential and the second word line potential are each set in response to one or more fuses of the memory device.

20. The method of claim 15, wherein the second word line potential is greater than the first word line potential.

21. The method of claim 20, wherein the second word line potential is less than a word line potential used to read memory cells during a read operation of the memory device.

* * * * *

UNITED STATES PATENT AND TRADEMARK OFFICE
CERTIFICATE OF CORRECTION

PATENT NO. : 7,565,587 B2  
APPLICATION NO. : 11/519415  
DATED : July 21, 2009  
INVENTOR(S) : Imondi et al.

Page 1 of 1

It is certified that error appears in the above-identified patent and that said Letters Patent is hereby corrected as shown below:

On the Title Page, Item (30), in "Foreign Application Priority Data", line 1, delete "RM2001A0647" and insert -- RM2001A000647 --, therefor.

In column 1, line 7, after "10/286,450" delete "(allowed)".

In column 5, line 39, in Claim 1, delete "to not be" and insert -- not to be --, therefor.

Signed and Sealed this

First Day of September, 2009

David J. Kappos  
*Director of the United States Patent and Trademark Office*

UNITED STATES PATENT AND TRADEMARK OFFICE
Certificate

Patent No. 7,565,587 B2                                                                             Patented: July 21, 2009

On petition requesting issuance of a certificate for correction of inventorship pursuant to 35 U.S.C. 256, it has been found that the above identified patent, through error and without any deceptive intent, improperly sets forth the inventorship.

Accordingly, it is hereby certified that the correct inventorship of this patent is: Maurizio Di Zenzo, Avezzano (IT); Maria Luisa Gallese, Avezzano (IT); Giuliano Gennaro Imondi, Rieti (IT); and Giovanni Naso, Frosinone (IT).

Signed and Sealed this Thirteenth Day of November 2012.

*ALBERT DECADY*
*Supervisory Patent Examiner*
*Art Unit 2112*
*Technology Center 2100*